(12) United States Patent
Kanda

(10) Patent No.: US 6,922,093 B2
(45) Date of Patent: Jul. 26, 2005

(54) RADIO FREQUENCY AMPLIFIER AND METHOD OF DRIVING THE SAME

(75) Inventor: Tetsuya Kanda, Tokyo (JP)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/229,777

(22) Filed: Aug. 28, 2002

(65) Prior Publication Data

US 2003/0042977 A1 Mar. 6, 2003

(30) Foreign Application Priority Data

Aug. 29, 2001 (JP) .................................. 2001-258984

(51) Int. Cl.$^7$ ............................................ H03K 3/17
(52) U.S. Cl. ..................... 327/172; 330/134; 455/127.2
(58) Field of Search ............................... 327/172–174; 330/10, 127, 134, 135; 455/127.1, 127.2

(56) References Cited

U.S. PATENT DOCUMENTS

| | | | | |
|---|---|---|---|---|
| 4,232,679 A | * | 11/1980 | Schulman | .................... 607/33 |
| 4,600,892 A | * | 7/1986 | Wagner et al. | ............... 330/144 |
| 4,806,867 A | * | 2/1989 | Hanawa et al. | ............. 324/314 |
| 5,546,001 A | * | 8/1996 | Miura | ......................... 324/322 |

OTHER PUBLICATIONS

"Solid State Radio Engineering", Krauss, Herbert L. (1980), p. 432–454. Sec. 14. High Efficiency Power Amplifiers.
Motorola Application Information AR141, "Applying Power MOSFETs in Class D/E RF Power Amplifier Design", H.O. Granberg (1985).
Agilent 7500 Series ICP–MS, May 2001.

* cited by examiner

Primary Examiner—Kenneth B. Wells

(57) ABSTRACT

A radio frequency amplifier and a method of driving the radio frequency amplifier which are excellent in the controllability at the time of a low power output while keeping the advantage of a high efficiency and give the heating generated by a power loss of such a degree that dewing generated due to over-cooling by the cooling system is not generated at the time of a low power output. The radio frequency amplifier is structured by a variable wave height and a variable wave width pulse wave generating circuit that generates a pulse wave (rectangular wave) having an arbitrary pulse height and pulse width, and a power amplifier that is driven by the rectangular wave.

7 Claims, 5 Drawing Sheets

(a)

(b)

(a)

(b)

(a)

(b)

RADIO FREQUENCY AMPLIFIER AND METHOD OF DRIVING THE SAME

FIELD OF INVENTION

The present invention relates a radio frequency amplifier and a method of driving the radio frequency amplifier, and more particularly to a radio frequency amplifier that generates a radio frequency plasma, and most particularly to a radio frequency amplifier for generating an inductively coupled plasma used in an inductively coupled plasma mass spectrometer (ICP-MS) and an inductively coupled plasma optical or atomic emission spectrometer (ICP-OES/AES) and a method of driving the radio frequency amplifier. However, the present invention is also widely applicable to general radio frequency amplifiers.

DISCUSSION OF THE BACKGROUND ART

In the inductively coupled plasma mass spectrometer, the inductively coupled plasma optical or atomic emission spectrometer or the like, an inductively coupled plasma generating device is employed. In this example, the radio frequency amplifier of the inductively coupled plasma generating device will be described. FIG. 4 is a schematic diagram showing an inductively coupled plasma generating device. In the figure, reference numeral 1 denotes an amplifier. A coil 4 of a plasma generating portion is driven through a matching box 3 by the amplifier 1. As the number of turnings of the coil, for example, about 3 turns are used as shown in the figure. The matching box 3 is disposed in order to match a plasma side impedance and an output impedance of the amplifier 1, but is not always required.

The coil 4 is wound on a plasma torch 6 which is made up of triple tubes of quartz. Then, an output of the amplifier 1 is connected to one end of the coil 4 through the matching box, and the other end of the coil 4 is grounded. For example, argon (Ar) gas is made to flow into the plasma torch 6 and a radio frequency current is made to flow in the coil 4, to thereby supply a power to the plasma 5 by inductive coupling so as to maintain discharge. When plasma is ignited, a small spark discharge is allowed to be generated within the plasma torch 6 by a discharge device not shown, and a transitional impedance matching according to a proper radio frequency power to ignite the plasma and a state in which no plasma exists is taken so that the power is supplied to the plasma 5 from the coil 4 with inductive coupling by rapidly increasing the current of spark discharge, thus igniting the plasma.

In a stationary state where the plasma is ignited, when the radio frequency output is operated with, for example, 1 kW, the amplifier 1 is heated with several hundreds of W because of power loss. Therefore, a cooling pipe 2 is disposed on a heating portion of the amplifier 1 so that cooling water circulates. In this way, the amplifier 1 is so cooled as to prevent the parts from being destroyed due to a heat.

In this case, the coil 4 serves as a load of the amplifier 1. FIGS. 5A and 5B are schematic diagrams showing a radio frequency amplifier, in which FIG. 5A is the radio frequency amplifier and FIG. 5B is an equivalent circuit thereof. This circuit is an unsaturated operation power amplifier which is a transformer coupling push/pull amplifier using a MOS-FET (metal-oxidized semiconductor field effect transistor, hereinafter referred to as "FET") as an amplifying device of A/B/C class. This example shows the use of an FET as the amplifying device, but the same circuit structure is applied even if another amplifying device is employed. An input radio frequency signal is inputted to a primary winding of a transformer T1. A radio frequency signal is generated on a secondary winding of the transformer T1 in accordance with the primary winding. A bias voltage that determines the operating point of the amplifying device is applied to a neutral point of two windings on the secondary winding of the transformer T1. A radio frequency signal resulting from synthesizing those signals is inputted to gates of FETs Q1 and Q2. The FETs Q1 and Q2 operate in accordance with the input radio frequency signal, and the functions thereof can be represented by a variable resistor VR shown in FIG. 5B. Loads of the FETs Q1 and Q2 are connected to a primary winding of a transformer T2, and a voltage V is applied to the neutral point of the primary winding.

When the FETs Q1 and Q2 operate in accordance with the input radio frequency signal, the primary winding of the transformer T2 is driven, and a radio frequency power is transmitted to a secondary winding of the transformer T2. A load 7 is driven by the radio frequency. As a result, the radio frequency power that is supplied to the load 7 can be varied in accordance with the input signal under the control.

In the above-mentioned conventional unsaturated operation power amplifier, the controllability is excellent because the output power is obtained in accordance with the input signal. However, in case of the B-class operation, there arises such a problem that the efficiency cannot be enhanced so that the theoretical maximum efficiency is 78.5%. In the case where the power amplifier is operated by, for example, an output of 1.6 kW, the efficiency is limited to about 60% in fact, and heat of 1 kW or less is generated in the amplifier. The cooling capability of the cooling water circulating device for removing the heat is increased correspondingly. A large-sized cooling water circulating device is large in noise, as a result of which because an expensive cooling water circulating device which is high in cooling capability is required and the cooling water circulating device is noisy, the cooling water circulating device may be located in another room in some cases. In addition, a power supply capacity itself of the amplifier increases, resulting in an inhibition factor of downsizing of the entire device.

SUMMARY OF THE INVENTION

The present invention has been made in view of the above-mentioned problems, and therefore a first object of the present invention is to provide a radio frequency amplifier (Invention I) which realizes the high efficiency of an inductively coupled plasma generation radio frequency amplifier used in an inductively coupled plasma mass spectrometer and an inductively coupled plasma optical or atomic emission spectrometer. A second object of the present invention is to provide a general radio frequency amplifier and a method of driving the radio frequency amplifier, which is capable of setting a power consumption or the efficiency as a control input with the improvement in problems such as the deterioration of the controllability at the time of a low output and dewing at the time of the low output operation, caused by over-cooling which results from operating the cooling system with the same cooling capability of that at the time of the high output, which are side reactions of Invention I.

Invention I provides a radio frequency amplifier for generating an inductively coupled plasma in an inductively coupled plasma mass spectrometer and an inductively coupled plasma optical or atomic emission spectrometer, said radio frequency amplifier comprising a pulse width control circuit that controls the pulse width upon receiving an output control signal; and a power amplifier that is driven by the pulse width control circuit.

According to Invention I, such a problem that the efficiency of a radio frequency amplifier that has been employed up to now is solved by using a radio frequency amplifier including a pulse width control circuit that controls a pulse width upon receiving an output control signal and a power amplifier that is driven by the pulse width control circuit, that is, a D/E class power amplifier in an inductively coupled plasma mass spectrometer and an inductively coupled plasma optical or atomic emission spectrometer. The power supply application efficiency of the D/E class power amplifier is extremely high to the degree of 100% in theory, thereby being capable of downsizing and simplifying a power device and a cooling device for the radio frequency amplifier. In addition, the following unique effects can be indicated by the application of the present invention. That is, as unique improvements, in an unstable transitional output state when plasma is ignited where impedance matching is insufficient, it is hard to destroy the radio frequency amplifier, and it is easy to maintain an output until plasma is ignited, and also discharge is readily developed due to an increase in harmonic components, and the plasma is readily ignited for those reasons.

However, in the case where the D/E class power amplifier is going to be operated at a radio frequency, in particular, a lower output is going to be obtained, a required pulse width is extremely narrowed, and for example, when the output frequency f is set to 20 MHz, the pulse width Pw of the duty ratio 5% is represented as follows.

$$Pw=(1/20E+6)\times10\%=5 \text{ nSec}$$

Thus, it is difficult to conduct controlling with stability. Also, the harmonic components further increases, and a spurious radiation increases.

Also, in the D/E class power amplifier, assuming that the on/off transition period of time of the switching element is 0 at the time of the low output, the generated loss is caused by only the conductive resistance of the switching element, and a period of time during which the conductive resistance generates the loss is in proportion to a period of time during which the switching element is rendered conductive. For that reason, when the pulse width is narrowed in order to lower the output power, the period of time during which the switching element is rendered conductive is shortened, and the generated loss is further lowered. Therefore, the quantity of heat generated is extremely lowered, and when the same cooling as that at the time of the high output is conducted, a drawback such as dewing may occur. Invention II–VI have been made in view of those side reactions.

Invention II is a radio frequency power amplifier comprising a variable wave height and variable wave width pulse wave generating circuit that receives a pulse width control signal and a pulse height control signal to generate a rectangular pulse wave having an arbitrary pulse height and pulse width; and a power amplifier that is driven by the rectangular wave.

According to Invention II, the above-mentioned efficiency is satisfactory, but in order to solve a side reaction such that dewing is liable to occur because it is difficult to conduct stable control at the time of the low output and over-cooling is conducted, there is provided a radio frequency amplifier including a variable wave height and variable wave width pulse wave generating circuit that generates a pulse wave (rectangular wave) having an arbitrary pulse height and pulse width upon receiving a pulse width control signal and a pulse height control signal so that the conventional output control according to the pulse height can be added to the output control according to the pulse width, and a power amplifier that is driven in accordance with a rectangular wave that is generated by the variable wave height and variable wave width pulse wave generating circuit. This circuit conducts the D/E class operation when the high output is required, to thereby obtain the high efficiency as described above. However, if the same cooling as that at the time of the high output is conducted with keeping the high efficiency at the time of the low output, dewing occurs due to over-cooling resulting in a cause of failure of the circuit. Therefore, at the time of the low output, the pulse width control is conducted to some degree, and the pulse height is controlled, thereby the loss to a degree with which dewing can be prevented, that is, the heat is generated so as to solve the side reaction such as dewing that occurs in the case where control is made till the low output by only the pulse width control. Furthermore, in this case, because the control of the pulse height is added, it is unnecessary to extremely narrow the drive pulse width at the time of the low output, and there can be solved problems such as the deterioration of the controllability which is caused by the narrowed drive pulse width, the difficulty of the circuit design and manufacture and an increase in spurious radiation.

Invention III is the radio frequency amplifier as defined above as Invention II, characterized in that said variable wave height and variable wave width pulse wave generating circuit generates a control rectangular wave having a sufficient pulse height to saturate a power switching element used in a switching power amplifier and operates the power amplifier with a high efficiency through saturated operation of the switching element in the case where a high efficiency is required, and decreases the efficiency of the power amplifier through unsaturated operation of the switching element by a control input a lower pulse height in the case of a low output and where a relatively high efficiency is not required.

According to Invention III, in the variable wave height and variable wave width pulse wave generating circuit, the pulse height is controlled to conduct unsaturated operation so that the conductive resistance of the switching element increases. This operation is added to the pulse width control at the time of the low output, thereby being capable of solving the problem of the over-cooling because the heating necessary for the power loss in the conductive resistance of the switching element is obtained.

Invention IV is the radio frequency amplifier as defined above as Invention II or III, characterized in that said variable wave height and variable wave width pulse wave generating circuit controls the pulse width and the pulse height of the rectangular wave that drives the power switching element so as to to control power consumption within a certain range in addition to an output power.

According to Invention IV, in the variable wave height and variable wave width pulse wave generating circuit, the output control according to the pulse height is added to the output control according to the pulse width, and the power consumption (power application efficiency) is set as a control parameter. The radio frequency amplifier operates in accordance with the input values of the output power and the power consumption (power application efficiency), which are set in advance, and the set input mainly uses the pulse width control to make the power application efficiency maximum at the time of the high output whereas the pulse height control is added so as to prevent the power application efficiency from being too high at the time of the low output, thereby being capable of solving problems such as the controllability and over-cooling at the time of the low output.

Invention V is the radio frequency amplifier as defined above as any Invention of II, III and IV, characterized in that the pulse height and the pulse width are controlled to set the power consumption in accordance with the output power so as to maintain a loss constant.

According to Invention V, in the variable wave height and variable wave width pulse wave generating circuit, the output control according to the pulse height is added to the output control according to the pulse width, and control is made to maintain the loss power constant. Control is so made as to provide the loss power set with the output power of a predetermined operation range. In this case, the load of the amplifier with respect to the cooling system becomes constant, and the excellent efficiency is obtained without worrying about over-cooling. Also, the controllability at the time of the low output is excellent.

Invention VI is a method of driving a radio frequency amplifier, characterized in that an output control is conducted by a combination of the control of a pulse width and a pulse height in a radio frequency amplifier, and in particularly the pulse width control is mainly employed at the time of a high output and the pulse height control is added to the pulse width control at the time of a low output, to thereby adjust a power consumption.

According to Invention VI, the efficiency described in the invention of claim 5 is excellent, but in order to solve the side reactions such that it is difficult to conduct stable control at the time of the low output and dewing is liable to occur because of over-cooling, there is provided a method of driving a power amplifier in accordance with a pulse wave (rectangular wave) having an arbitrary pulse height and pulse width upon receiving the pulse width control signal and the pulse height control signal so that the conventional output control according to the pulse height can be added to the output control according to the pulse width.

Figure 1:
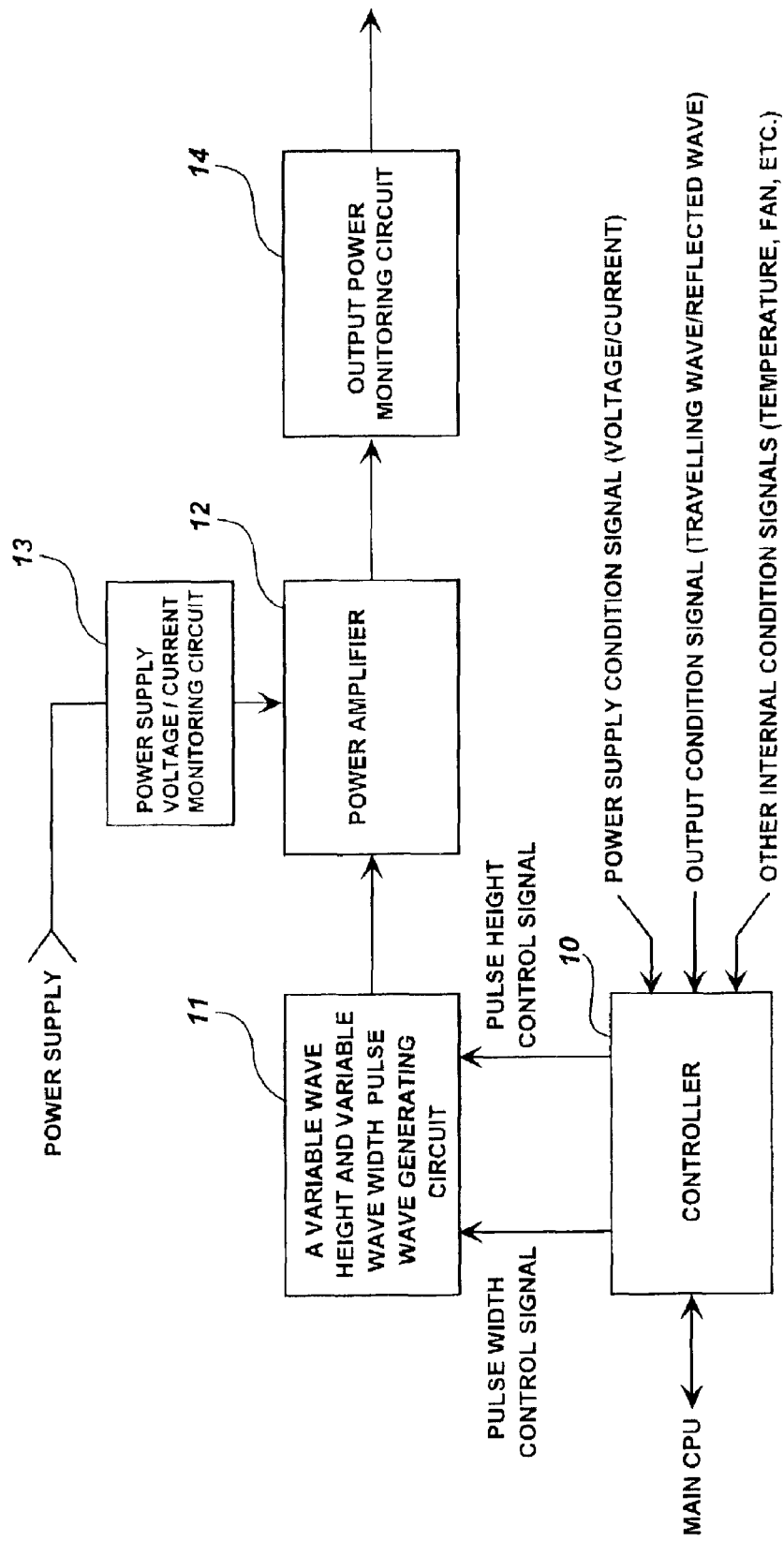
FIG. 1 is a block diagram showing the most general operation in accordance with an embodiment of the present invention.

In the drawings, the numerical references are 10: controller, 11: variable wave height and variable wave width pulse wave generating circuit, 12: power amplifier, 13: supply voltage/current monitoring circuit, 14: output power monitoring circuit.

DETAILED DESCRIPTION OF INVENTION

Hereinafter, embodiments of the present invention will be described in detail with reference to the drawings.

Figure 2:
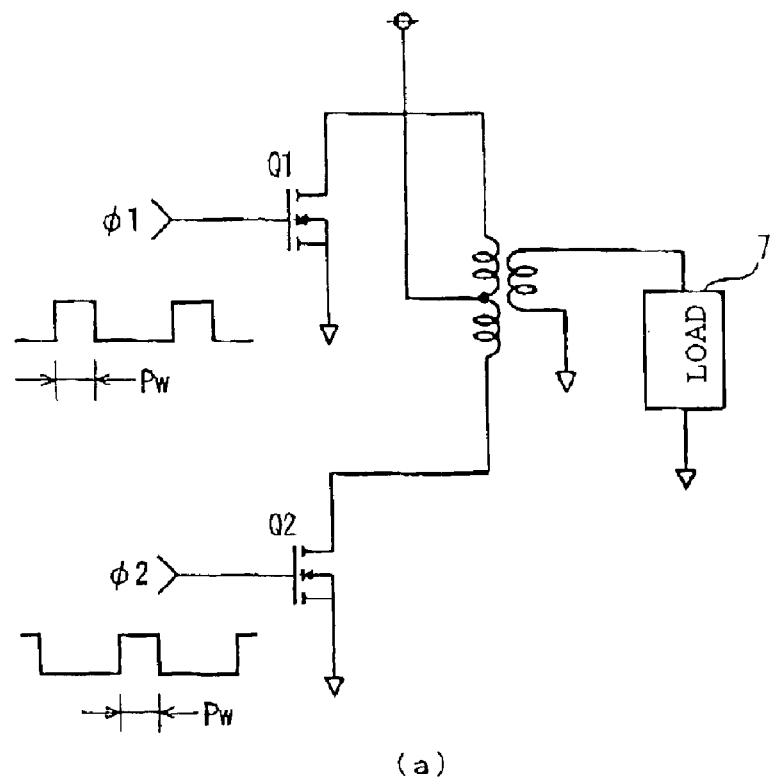
FIG. 2 is diagrams showing a radio frequency amplifier in accordance with an embodiment of the present invention, which corresponds to claim 5.
Figure 2:
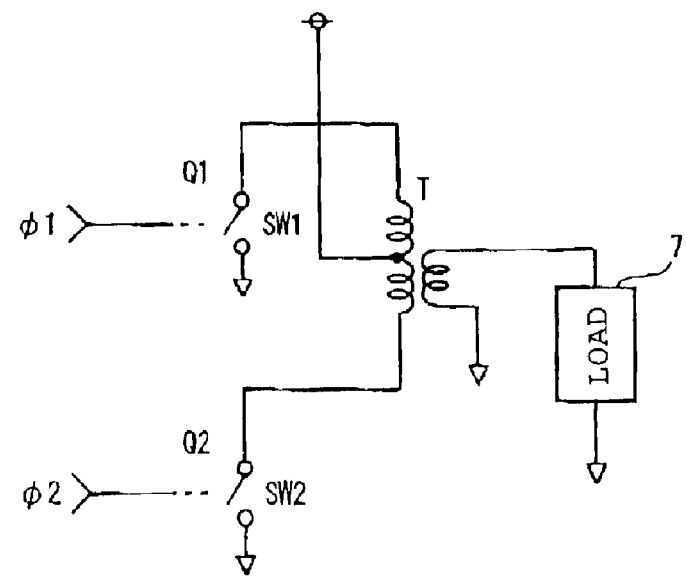
Figure 5:
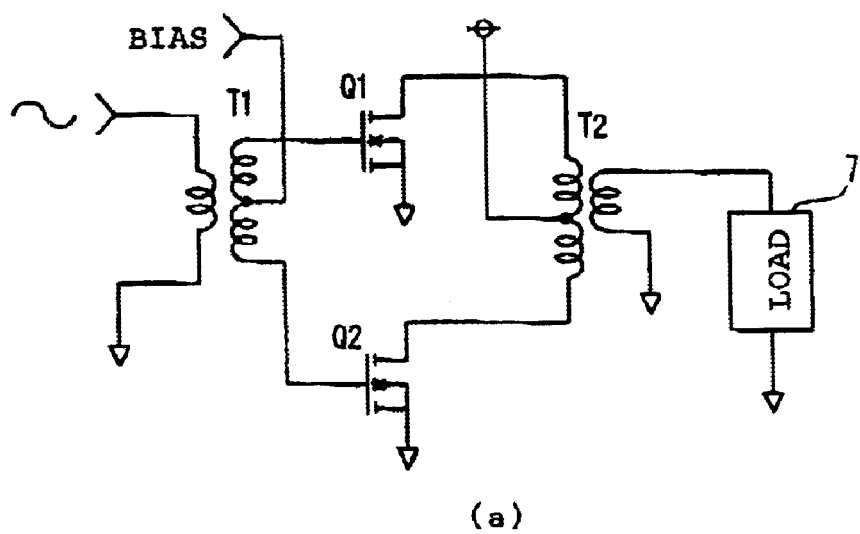
FIG. 5 is schematic diagrams showing a conventional example of an inductively coupled plasma generation radio frequency amplifier used in an inductively coupled plasma mass spectrometer.
Figure 5:
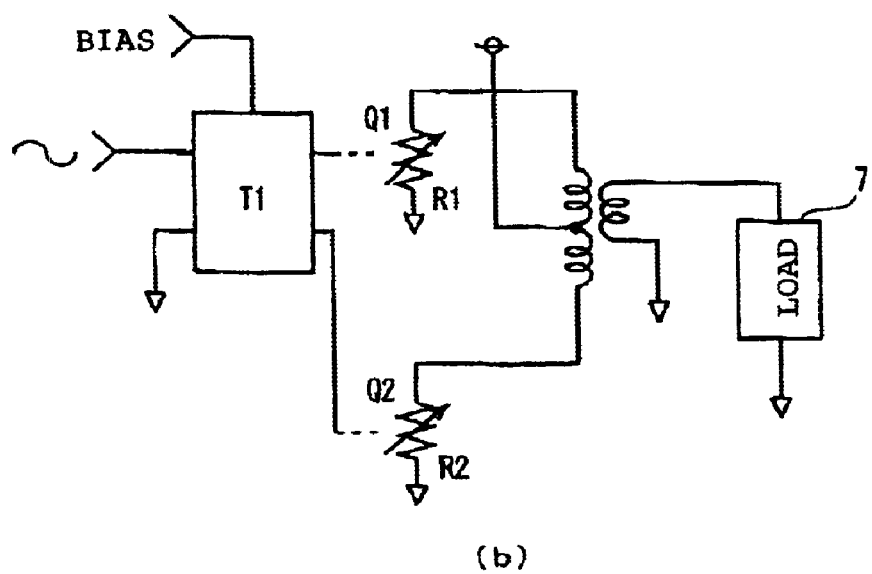

First, Invention I will be described. A D/E class switching circuit is structured, for example, as shown in FIGS. 2A and 2B. Parts identical with those in FIGS. 5A and 5B are designated by like references. FIG. 2A is the switching circuit and FIG. 2B is an equivalent circuit thereof. This circuit is directed to a transformer coupling push/pull amplifier using an FET as the D/E class switching element, which shows a saturated operation power amplifier. In this example, there is used the FET as the switching element, but the same structure is applied even in the case where another switching element is employed.

Input pulse waves which are represented by $\phi1$ and $\phi2$ are inputted to the gates of FETs Q1 and Q2. The input pulse waves $\phi1$ and $\phi2$ have the same frequency f as that of a target radio frequency and 50% in the maximum duty ratio, and $\phi1$ and $\phi2$ are also given a phase difference of 180 degrees. The FETs Q1 and Q2 alternately conduct the on/off operation in accordance with an input pulse, and their functions can be represented by switches SW1 and SW2 shown in FIG. 2B. The loads of the FETs Q1 and Q2 are connected to the primary winding of the transformer T, and a voltage V is applied at a neutral point of the primary winding. When the FETs Q1 and Q2 alternately conduct the on/off operation in accordance with the input pulse signal, the primary winding of the transformer T is driven, and a power is transmitted to the secondary winding of the transformer T in accordance with the on operation of the respective FETs. When the pulse waves $\phi1$ and $\phi2$ are in the maximum duty operation (duty ratio=50%), the circuit is in the D-class operation and becomes in the maximum output operation state where any one of Q1 and Q2 is always on. If the duty ratio of the pulse wave is 50% or less, there is a period of time where both of Q1 and Q2 are off, during which no power is transmitted to the secondary winding of T. This state is the E-class operation, and the output radio frequency power can be variably controlled in accordance with the duty ratio. The power application efficiency of the D/E class amplifier is 100% in theory, which is extremely high efficiency. The load 7 is driven by the radio frequency power. As a result, the radio frequency power that is supplied to the load 7 can be variably controlled in accordance with the duty ratio of the pulse wave. That is, the radio frequency for the inductively coupled plasma generation in an inductively coupled plasma mass spectrometer and an inductively coupled plasma light emission spectroscopic analysis device can be generated with efficiency, and the power supply device and the cooling device for the radio frequency amplifier can be downsized.

Figure 3:
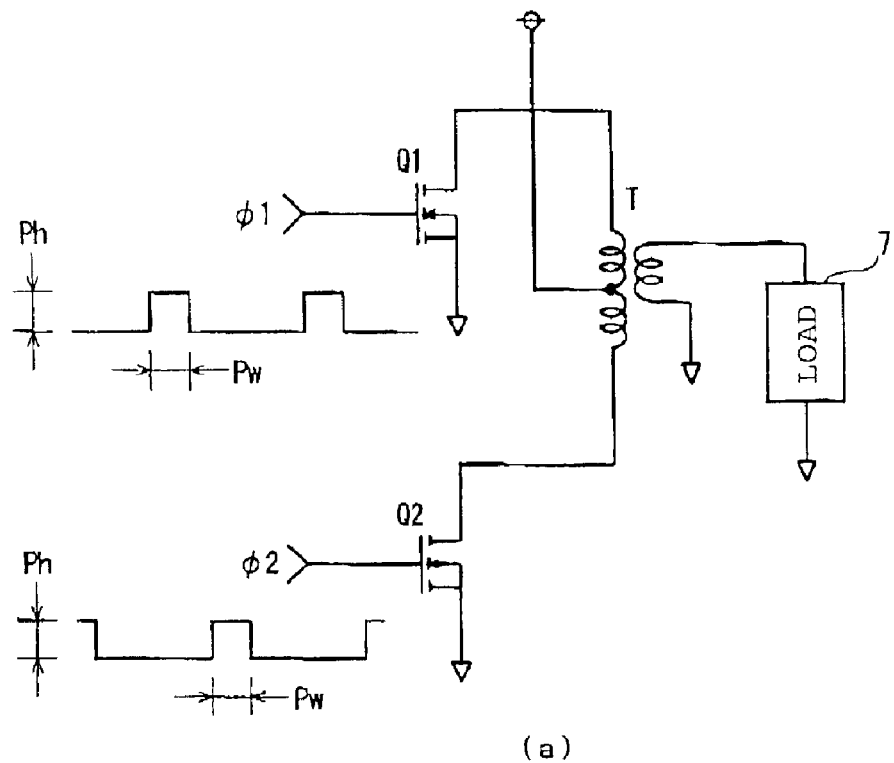
FIG. 3 is diagrams showing a radio frequency amplifier in accordance with an embodiment of the present invention, which corresponds to claims 1 to 4 and 6.
Figure 3:
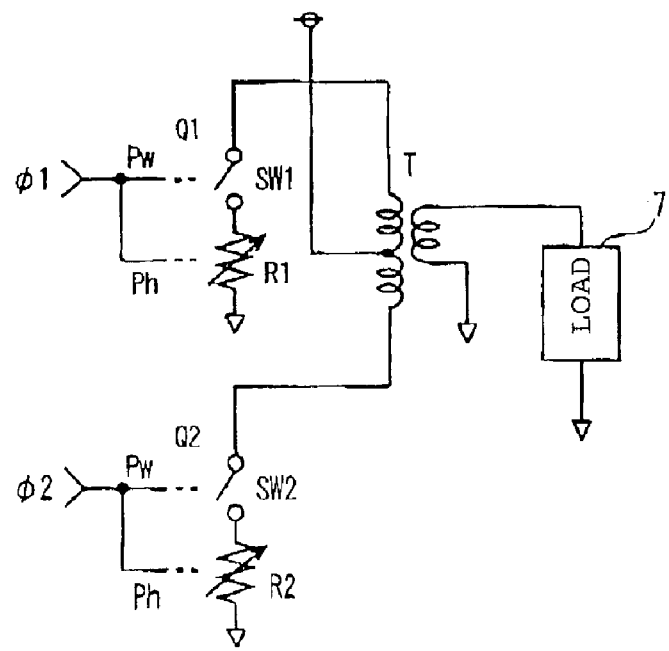
Figure 4:
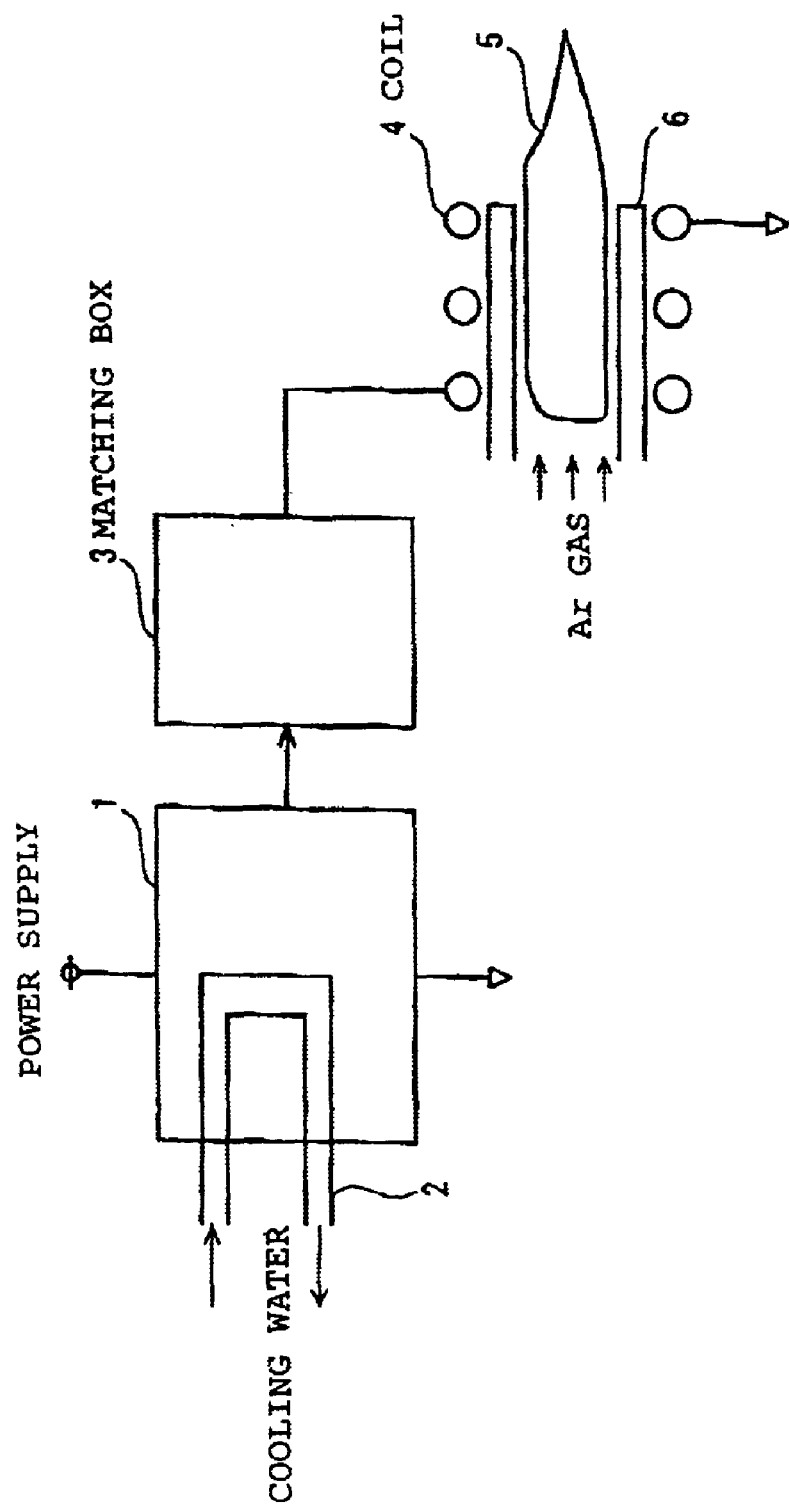
FIG. 4 is a schematic diagram showing an inductively coupled plasma generating device.

Subsequently, Invention II to VI will be described. A push/pull radio frequency amplifier to be used is shown in FIG. 3. Parts identical with those in FIGS. 2A and 2B are represented by like references. FIG. 3A is the push/pull radio frequency amplifier, and FIG. 3B is an equivalent circuit thereof. The equivalent circuit is made up of a series circuit of a switch SW1 and a conductive resistor R1 and a series circuit of a switch SW2 and a conductive resistor R2. This circuit conducts the D/E class operation when a high output power is required, thereby being capable of obtaining the high output with the high power application efficiency as described above. In the case of the D/E class operation, assuming that the on/off transitional period of time of the switching element is 0, the generated loss is caused by only very small conductive resistors R1 and R2, and a period of time during which those conductive resistors generate the loss is in proportion to a period of time during which SW1 and SW2 are on. Therefore, when the pulse width is narrowed in order to lower the output power, the period of time during which SW1 and SW2 are on is shortened, and the generated loss is particularly lowered. Also, the pulse width is very narrowed, and it is difficult to realize the control and the circuit operation. In addition, a generated higher harmonic wave component increases, and a spurious radiation also increases. Under the circumstances, in the case where the circuit is used at the low output, the pulse wave height is lowered, and the FETs Q1 and Q2 are allowed to conduct the unsaturated operation, to thereby conduct control so that the conductive resistors R1 and R2 increase equivalently.

An embodiment of a specific control of the push/pull radio frequency amplifier shown in FIG. 3 is also shown in a block diagram of FIG. 1. FIG. 1 shows an example of the radio frequency amplifier that aims at the generation of a continuous output that requires, for example, about 2 KW as a maximum output and is stabilized from an extremely low output such as several W, and a constant loss over a lower output such as several hundreds of W to the vicinity of the maximum output. However, it is needless to say that the present invention is not limited to this example. In the figure, reference numeral 10 denotes a controller that conducts the entire control operation. The controller 10 is formed of, for example, a CPU. Likewise, it is needless to say that the present invention is not limited to the CPU as the controller, and it is also possible to constitute a controller 10 without using CPU. The controller 10 is connected to a main CPU (not shown) and transmits and receives signals therebetween. Reference numeral 11 denotes a variable wave height and variable wave width pulse wave generating circuit that conducts the drive pulse width/pulse height control upon receiving the pulse width control signal and the pulse height control signal from the controller 10.

Reference numeral 12 denotes a power amplifier that conducts power amplification upon receiving an output of the variable wave height and variable wave width pulse wave generating circuit 11, and 13 is a power supply voltage/current monitoring circuit. Reference numeral 14 denotes an output power monitoring circuit that monitors an output of the power amplifier 12, and its monitor output is given to the controller 10. The controller 10 is inputted with a voltage and a current from the power supply voltage/current monitoring circuit 13, and also inputted with a travelling wave and a reflected wave from the output power monitoring circuit 14, and additionally inputted with temperatures of the respective portions, a fan state and so on. The controller 10 always monitors those signals, and controls the variable wave height and variable wave width pulse wave generating circuit 11 in accordance with those monitor signals. The operation of the device thus structured will be described below.

For example, when an output of the amplifier is set from the main CPU, the controller 10 then gives the pulse width control signal and the pulse height control signal corresponding to the set output and the required power loss to the variable wave height and variable wave width pulse wave generating circuit 11.

The power amplifier 12 is controlled in accordance with an output of the variable wave height and variable wave width pulse wave generating circuit 11, and the radio frequency power is supplied to the load (not shown). The output power monitoring circuit 14 always monitors the output of the power amplifier 12, and its output is fed back to the controller 10. The controller 10 controls the output of the power amplifier 12 while monitoring the output of the output power monitoring circuit 14 so that the output becomes the output set in the main CPU so as to generate the loss set in accordance with the output power. This example shows the control using a closed loop, but it is possible to operate by an open loop.

As described above, according to this embodiment, with an increase in the conductive resistance of the switching element at the time of an extremely low output, the loss at the conductive resistance portions increases with the result that when it is necessary to lower the output power, the output can be controlled without extremely narrowing the drive pulse width. Also, as the side reaction, the problem such as the over-cooling can be solved while the high efficiency advantage is maintained over the wide output power range of from the lower output to about the maximum output.

As was described above in detail, the present invention obtains the following technical advantages:

(1) According to Invention II, because the drive pulse width and the drive pulse height can be varied over all area of the required output power range, the output power controllability that is high in efficiency and excellent can be obtained.

(2) According to Invention III, because a loss which is caused by the switching element can increase at the time of a low output, the efficiency is lowered, and a loss necessary to prevent a dewing due to over-cooling, that is, the heating can be obtained.

(3) According to Invention IV, in the case where the output power is required to be lowered, since a power consumption (power supply application efficiency) is set as a parameter, an output power control that uses not only the pulse width control but also the pulse height control is combined, thereby being capable of obtaining a stable output control and reducing the spurious radiation (higher harmonic wave).

(4) According to Invention V, because the loss of the radio frequency amplifier is constant, only a constant and minimum load can be applied to the cooling system side of the amplifier. Therefore, the operation can be stabilized with the cooling system having the minimum cooling capability, and it is also easy to set the circuit so that the dewing caused by over-cooling is prevented.

(5) According to Invention I, although the conventional device requires a large cooling system and must enlarge the power supply capacity because of an inductively coupled plasma mass spectrometer and an inductively coupled plasma light emission spectroscopic analysis device which are low in the power application efficiency, a small cooling system can be used because of the high efficiency of the radio frequency power supply that consumes the maximum power, and the entire power supply capacity is also lessened. In addition, the turning on of the plasma becomes facilitated as compared with the conventional one.

(6) According to Invention VI, there can be realized the radio frequency amplifier that is high in efficiency when the high output is required and maintains the necessary loss when the low output is necessary, and can conduct stable control.

What is claimed is:

1. A radio frequency power apparatus comprising:
   a power amplifier that has an output power range and that is driven by a rectangular pulse wave with a controllable pulse width and a controllable pulse height over said output power range;
   at least one circuit that monitors a variable condition and provides a signal representing said variable condition; and
   a pulse wave controller that generates said rectangular pulse wave, wherein said controller, based on said signal, controls said pulse height and said pulse width to provide said rectangular pulse wave with a first duty ratio and a first pulse height that operates said power amplifier with a first efficiency and a first power loss in an upper portion of said output power range and with a second duty ratio and a second pulse height that operates said power amplifier with a second efficiency and a second power loss in a lower portion of said output power range, and wherein said first efficiency is higher than said second efficiency and said first power loss is lower than said second power loss.

2. The radio frequency power apparatus of claim 1, wherein said power amplifier comprises a power switching element, wherein said first pulse height causes said power swicthing element to operate in a saturated state, and wherein said second pulse height causes said power switching element to operate in an unsaturated state.

3. The radio frequency power apparatus of claim 1, wherein said power amplifier comprises a power switching element, and wherein said pulse wave controller also control said rectangular pulse wave based on a power consumption parameter to maximize said first efficiency.

4. The radio frequency power apparatus of claim 1, wherein said pulse wave controller also controls said rectangular pulse wave to set a power consumption of said power amplifier in accordance with an output power thereof so as to maintain a loss constant.

5. The radio frequency power apparatus of claim 1, wherein said variable condition is selected from the group consisting of: temperature, voltage/current of a power supply connected to said power amplifier and output signal of said power amplifier.

6. A radio frequency apparatus that generates an inductively coupled plasma in an inductively coupled plasma mass spectrometer or an inductively coupled optical or atomic mission spectrometer, said radio frequency apparatus comprising:

a power amplifier that has an output power range, that is driven by a rectangular pulse wave with a controllable pulse width and a controllable pulse height over said output power range and that has an output coupled to a device that generates said inductively coupled plasma;

at least one circuit that monitors a variable condition and provides a signal resenting said variable condition; and a pulse wave controller that generates said rectangular pulse wave, wherein said controller, based on said signal, controls said pulse height and said pulse width to provide said rectangular pulse wave with a first duty radio and a first pulse height that operates said power amplifier with a first efficiency and a first power loss in an upper portion of said output power range and with a second duty radio and a second pulse height that operates said power amplifier with a second efficiency and a second power loss in a lower portion of said output power range, and wherein said first efficiency is higher than said second efficiency and said first power loss is lower than said second power loss.

7. The radio frequency power apparatus of claim 6, wherein said variable condition is selected from the group consisting of: temperature, voltage/current of a power supply connected to said power amplifier and output signal of said power amplifier.

* * * * *